(12) United States Patent
Park et al.

(10) Patent No.: US 12,300,156 B2
(45) Date of Patent: May 13, 2025

(54) PIXEL CIRCUIT AND DISPLAY DEVICE HAVING THE SAME

(71) Applicant: Samsung Display Co., LTD., Yongin-si (KR)

(72) Inventors: Junhyun Park, Suwon-si (KR); Hyeongseok Kim, Hwaseong-si (KR); Heejean Park, Suwon-si (KR); Minjae Jeong, Hwaseong-si (KR); Mukyung Jeon, Ulsan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/354,419

(22) Filed: Jul. 18, 2023

(65) Prior Publication Data

US 2024/0038148 A1 Feb. 1, 2024

(30) Foreign Application Priority Data

Jul. 28, 2022 (KR) .......................... 10-2022-0094068

(51) Int. Cl.
*G09G 3/32* (2016.01)
*H10K 59/121* (2023.01)

(52) U.S. Cl.
CPC ........... *G09G 3/32* (2013.01); *H10K 59/1213* (2023.02); *G09G 2300/0819* (2013.01); *G09G 2300/0852* (2013.01); *G09G 2300/0861* (2013.01); *G09G 2310/08* (2013.01)

(58) Field of Classification Search
CPC ............. G09G 3/32; G09G 2300/0819; G09G 2300/0852; G09G 2300/0861; G09G 2310/08; G09G 2300/0426; G09G 2320/0233; G09G 3/3233; G09G 2310/0251; G09G 2340/0435; G09G 2300/043; G09G 2300/0842; H10K 59/1213; H10K 59/1216; H10K 59/12; H10K 50/805; H01L 27/1255; H01L 27/124

See application file for complete search history.

(56) References Cited

U.S. PATENT DOCUMENTS

2023/0099387 A1 3/2023 Park et al.
2024/0213270 A1* 6/2024 Guo .................... H10K 59/1213

FOREIGN PATENT DOCUMENTS

KR 10-2021-0143970 11/2021
KR 10-2022-0014373 2/2022

* cited by examiner

*Primary Examiner* — Abhishek Sarma
(74) *Attorney, Agent, or Firm* — Womble Bond Dickinson (US) LLP

(57) ABSTRACT

A display device includes a substrate, a first active pattern above the substrate, a first gate layer above the first active pattern, and including a first capacitor electrode, a second gate layer above the first gate layer, and including a second capacitor electrode overlapping the first capacitor electrode, a second active pattern above the second gate layer, and including an extension portion above the second capacitor electrode, and a connection electrode above the second active pattern, and connecting the extension portion and the first capacitor electrode.

7 Claims, 14 Drawing Sheets

Cbst:BST1,BST2

GT3:GT3a,GT3b

SD: SD1, SD2, SD3, SD4, SD5, SD6, SD7

SD:SD1,SD2,SD3,SD4,SD6,SD7,CP1,CP2

PIXEL CIRCUIT AND DISPLAY DEVICE HAVING THE SAME

CROSS-REFERENCE TO RELATED APPLICATION(S)

This application claims priority to, and the benefit of, Korean Patent Application No. 10-2022-0094068 filed on Jul. 28, 2022, in the Korean Intellectual Property Office (KIPO), the entire disclosure of which is incorporated by reference herein.

BACKGROUND

1. Field

Embodiments relate to a pixel circuit and a display device having the same.

2. Description of Related Art

In general, a display device includes a display panel, a gate driver, a data driver, and a driving controller. The display panel includes a plurality of gate lines, a plurality of data lines, and a plurality of pixel circuits electrically connected to the plurality of gate lines and to the plurality of data lines. The gate driver provides gate signals to the plurality of gate lines, the data driver provides data voltages to the data lines, and the driving controller controls the gate driver and the data driver.

A boost capacitor may be connected to the driving transistor. The driving transistor may be affected by the boost capacitor in the self-scan period. The voltage of the control electrode of the driving transistor may be changed by the boost capacitor.

SUMMARY

Embodiments provide a display device with increased capacitor capacity.

Embodiments provide a pixel circuit for high-speed driving.

A display device according to one or more embodiments may include a substrate, a first active pattern above the substrate, a first gate layer above the first active pattern, and including a first capacitor electrode, a second gate layer above the first gate layer, and including a second capacitor electrode overlapping the first capacitor electrode, a second active pattern above the second gate layer, and including an extension portion above the second capacitor electrode, and a connection electrode above the second active pattern, and connecting the extension portion and the first capacitor electrode.

The extension portion may overlap the first capacitor electrode and the second capacitor electrode.

The second capacitor electrode may define an opening, wherein the connection electrode is connected to the first capacitor electrode through the opening.

The connection electrode may overlap the first capacitor electrode and the second capacitor electrode, and may be connected to the extension portion above the second capacitor electrode.

The connection electrode may be connected to the first capacitor electrode through a first contact hole, and may be connected to the extension portion through a second contact hole.

The first capacitor electrode and the second capacitor electrode may collectively include a storage capacitor.

The first gate layer may include a first boost electrode, wherein the second active pattern includes a second boost electrode overlapping the first boost electrode, and wherein the first boost electrode and the second boost electrode collectively include a boost capacitor.

The second boost electrode may be integrally formed with the extension portion.

The first active pattern may include a first hold electrode, wherein the second gate layer includes a second hold electrode overlapping the first hold electrode, and wherein the first hold electrode and the second hold electrode collectively include a hold capacitor.

The first active pattern may include a silicon semiconductor, wherein the second active pattern includes an oxide semiconductor.

A display device according to one or more embodiments may include a substrate, a first active pattern above the substrate, a first gate layer above the first active pattern, and including a first capacitor electrode, a second gate layer above the first gate layer, and including a second capacitor electrode overlapping the first capacitor electrode, a second active pattern above the second gate layer, and including an extension portion overlapping the second capacitor electrode, a first connection pattern above the second active pattern, and connected to the extension portion, and a second connection pattern above a same layer as the first connection pattern, spaced apart from the first connection pattern, and connected to the first capacitor electrode.

The first connection pattern may overlap the first capacitor electrode and the second capacitor electrode.

The second connection pattern may overlap the first capacitor electrode, wherein the second capacitor electrode defines an opening, and wherein the second connection pattern is connected to the first capacitor electrode through the opening.

A pixel circuit according to one or more embodiments may include a storage capacitor including a first electrode and a second electrode, a driving transistor including a first electrode, a control electrode connected the second electrode of the storage capacitor, and a second electrode, and configured to generate a driving current, a write transistor configured to write a data voltage to the second electrode of the storage capacitor in response to a write gate signal, a first initialization transistor configured to apply a first initialization voltage to the second electrode of the driving transistor in response to an initialization gate signal, a compensation transistor configured to transmit the first initialization voltage to the control electrode of the driving transistor and the second electrode of the storage capacitor in response to a compensation gate signal, and configured to receive the first initialization voltage from the first initialization transistor in response to the initialization gate signal, and a light-emitting element configured to emit light by receiving the driving current.

The control electrode of the driving transistor may be connected to a first node, wherein the first electrode of the driving transistor is connected to a second node, wherein the second electrode of the driving transistor is connected to a third node, wherein the first electrode of the storage capacitor is configured to receive a first power supply voltage, and wherein the second electrode of the storage capacitor is connected to the first node.

The write transistor may include a control electrode configured to receive the write gate signal, a first electrode connected to a data line configured to receive the data voltage, and a second electrode connected to the second node, wherein the compensation transistor includes a control electrode configured to receive the compensation gate signal, a first electrode connected to the third node, and a second electrode connected to the first node, and wherein the first initialization transistor includes a control electrode configured to receive the initialization gate signal, a first electrode configured to receive the first initialization voltage, and a second electrode connected to the third node.

The pixel circuit may further include a first emission transistor including a control electrode configured to receive an emission signal, a first electrode configured to receive the first power supply voltage, and a second electrode connected to the second node, a second emission transistor including a control electrode configured to receive the emission signal, a first electrode connected to the third node, and a second electrode connected to a fourth node, a second initialization transistor including a control electrode configured to receive a next write gate signal, a first electrode configured to receive a second initialization voltage, and a second electrode connected to the fourth node, and a boost capacitor including a first electrode configured to receive the write gate signal, and a second electrode connected to the third node.

The pixel circuit may further include a hold capacitor including a first electrode configured to receive the first power supply voltage, and a second electrode connected to the second node.

In a display scan period, the data voltage may be configured to be applied to the data line, wherein, in a self-scan period, a bias voltage is configured to be applied to the data line.

During the self-scan period, the compensation transistor may be turned-off.

In a display device according to embodiments of the present disclosure, as the display device includes a compensation transistor and a first initialization transistor connected in series to each other, connection between the second electrode of the boost capacitor and the control electrode of the driving transistor may be blocked in a self-scan period. Accordingly, the influence of the write gate signal variation on the control electrode of the driving transistor may be reduced or minimized.

By additionally including a hold capacitor in the display device, a compensation time for the threshold voltage of the driving transistor may be secured.

As the second active pattern includes an extension portion overlapping the first capacitor electrode and the second capacitor electrode, and the first capacitor electrode and the extension portion are connected on the first capacitor electrode and the second capacitor electrode through a connection electrode, an area of each of the first capacitor electrode and the second capacitor electrode may increase in the first direction. Accordingly, the capacity of the storage capacitor may be increased.

Also, similarly, an area of each of the first hold electrode and the second hold electrode may increase in the first direction. Accordingly, the capacity of the hold capacitor may increase.

DETAILED DESCRIPTION

Figure 1:
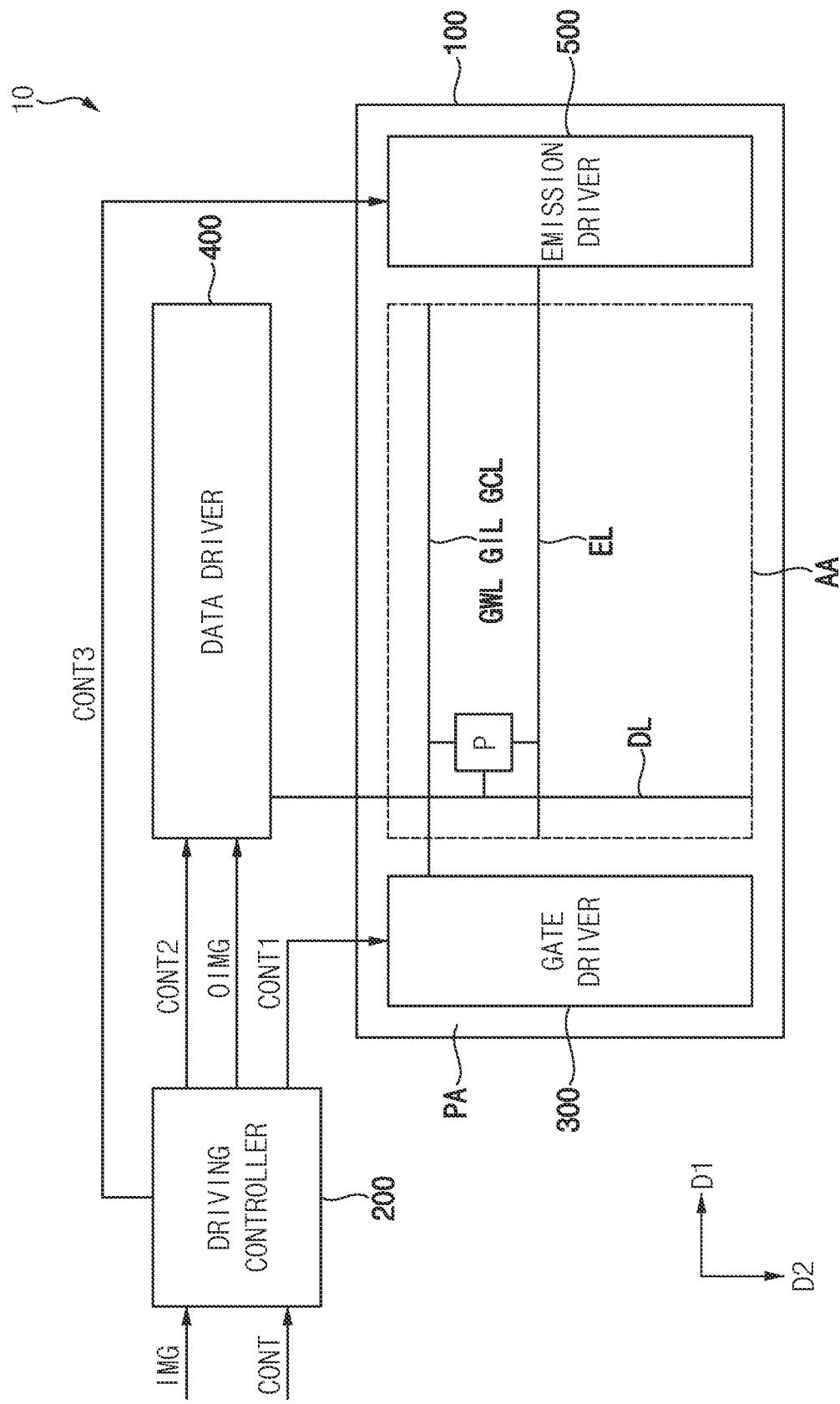
FIG. 1 is a block diagram illustrating a display device according to embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure.

Thus, embodiments disclosed herein should not be construed as limited to the illustrated shapes of regions, but are to include deviations in shapes that result from, for instance, manufacturing.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
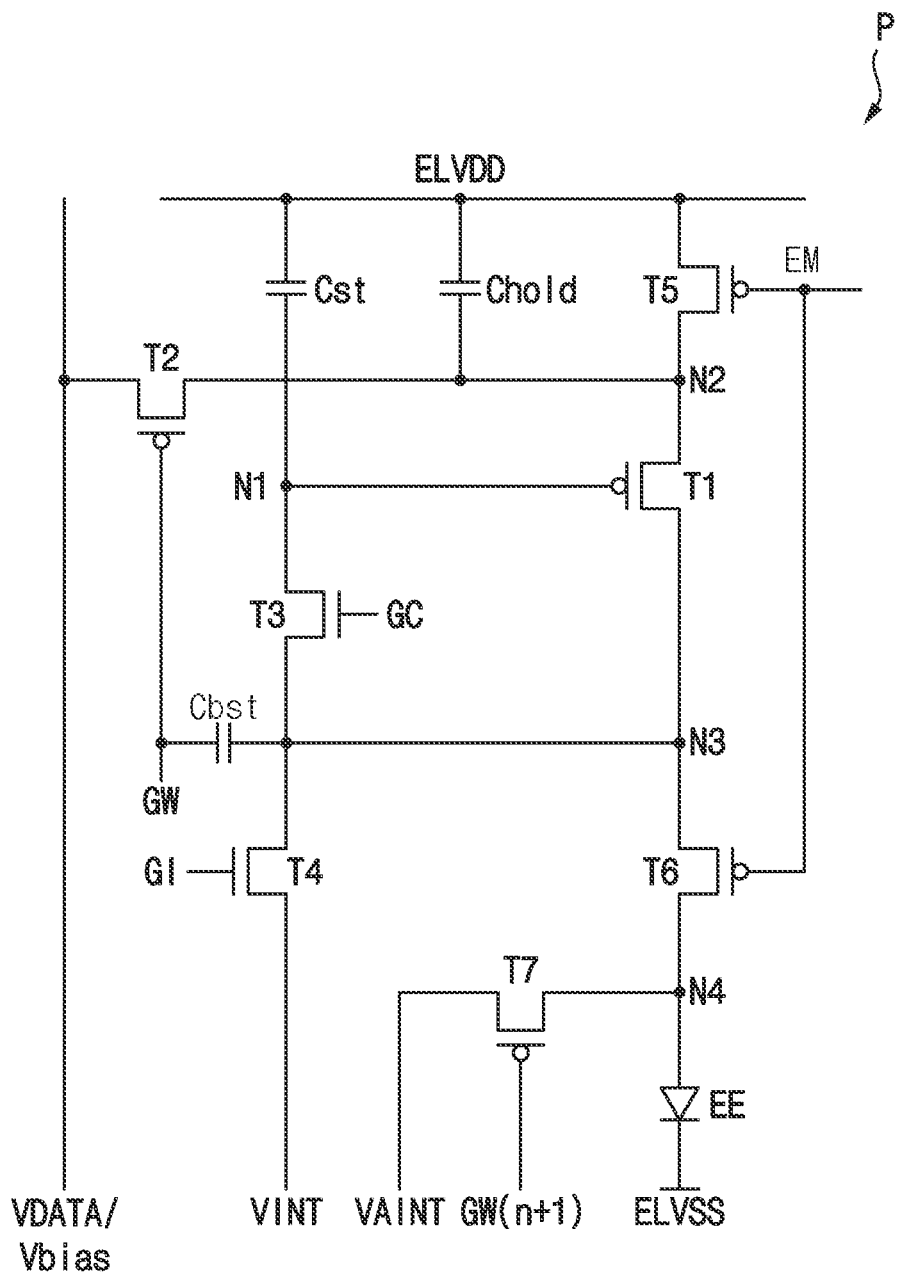
FIG. 2 is a circuit diagram illustrating an example of a pixel circuit included in the display device of FIG. 1.

FIG. 1 is a block diagram illustrating a display device according to embodiments. FIG. 2 is a circuit diagram illustrating an example of a pixel circuit included in the display device of FIG. 1.

Referring to FIGS. 1 and 2, a display device 10 may include a display panel 100 and a display panel driver. The display panel driver may drive the display panel 100 and may include a driving controller 200, a gate driver 300, a data driver 400, and an emission driver 500. In one or more embodiments, the driving controller 200 and the data driver 400 may be integrated on a single chip.

The display panel 100 may include a display area AA for displaying an image, and a peripheral area PA located adjacent to the display area AA. In one or more embodiments, the gate driver 300 and the emission driver 500 may be mounted on the peripheral area PA.

The display panel 100 may include a plurality of gate lines GWL, GCL, and GIL, a plurality of data lines DL, a plurality of emission lines EL, and a plurality of gate lines GWL, GCL, and GIL, a plurality of data lines DL, and a plurality of pixel circuits P electrically connected to the emission lines EL. The gate lines GWL, GCL, and GIL and the emission lines EL may extend in a first direction D1, and the data lines DL may extend in a second direction D2 crossing the first direction D1.

The driving controller 200 may receive input image data IMG and an input control signal CONT from a host processor (e.g., a graphic processing unit (GPU), etc.). For example, the input image data IMG may include red image data, green image data, and blue image data. In one or more embodiments, the input image data IMG may further include white image data. For another example, the input image data IMG may include magenta image data, yellow image data, and cyan image data. The input control signal CONT may include a master clock signal and a data enable signal. The input control signal CONT may further include a vertical synchronization signal and a horizontal synchronization signal.

The driving controller 200 may generate a first control signal CONT1, a second control signal CONT2, a third control signal CONT3, and may output image data OIMG based on the input image data IMG and the input control signal CONT.

The driving controller 200 may generate a first control signal CONT1 for controlling the operation of the gate driver 300 based on the input control signal CONT, and may output the first control signal CONT1 to the gate driver 300. The first control signal CONT1 may include a vertical start signal and a gate clock signal.

The driving controller 200 may generate a second control signal CONT2 for controlling the operation of the data driver 400 based on the input control signal CONT, and may output the second control signal CONT2 to the data driver 400. The second control signal CONT2 may include a horizontal start signal and a load signal.

The driving controller 200 may generate a third control signal CONT3 for controlling the operation of the emission driver 500 based on the input control signal CONT, and may output the generated third control signal CONT3 to the emission driver 500. The third control signal CONT3 may include a vertical start signal and an emission clock signal.

The driving controller 200 may generate output image data OIMG by receiving the input image data IMG and the input control signal CONT. The driving controller 200 may output the output image data OIMG to the data driver 400.

The gate driver 300 may generate gate signals GW, GC, and GI for driving the gate lines GWL, GCL, and GIL in response to the first control signal CONT1 received from the driving controller 200. The gate driver 300 may output gate signals GW, GC, and GI to respective gate lines GWL, GCL, and GIL. For example, the gate driver 300 may sequentially output the gate signals GW, GC, and GI to the gate lines GWL, GCL, and GIL, respectively. In one or more embodiments, the gate lines GWL, GCL, and GIL may include write gate lines GWL, initialization gate lines GIL, and compensation gate lines GCL. For example, the gate driver 300 may output the write gate signal GW to the write gate lines GWL. For example, the gate driver 300 may output the compensation gate signal GC to the compensation gate lines GCL. For example, the gate driver 300 may output the initialization gate signal GI to the initialization gate lines GIL.

The data driver 400 may receive the second control signal CONT2 and the output image data OIMG from the driving controller 200. The data driver 400 may generate a data voltage DATA by converting the output image data OIMG into an analog voltage. The data driver 400 may output the data voltage DATA to the data line DL.

The emission driver 500 may generate an emission signal EM for driving the emission line EL in response to the third control signal CONT3 received from the driving controller 200. The emission driver 500 may output the emission signal EM to the emission line EL.

Referring to FIG. 2, the pixel circuit P may include a light-emitting element EE, a driving transistor T1, a write transistor T2, a compensation transistor T3, a first initialization transistor T4, a first emission transistor T5, a second emission transistor T6, and a second initialization transistor T7.

The driving transistor T1 may generate a driving current, the first emission transistor T5 may apply the first power supply voltage ELVDD to the driving transistor T1 in response to the emission signal EM, and the second emission transistor T6 may apply the driving current to the light-emitting element EE in response to the emission signal EM.

The write transistor T2 may apply the data voltage DATA to the driving transistor T1 in response to the write gate signal GW, the compensation transistor T3 may connect the control electrode/gate electrode (e.g., a first node N1) of the driving transistor T1 and the second electrode (e.g., a third node N3) of the driving transistor T1 in response to the compensation gate signal GC, and the first initialization transistor T4 may apply the first initialization voltage VINT to the control electrode of the driving transistor T1 in response to the initialization gate signal GI. The second initialization transistor T7 may apply the second initialization voltage VAINT to the first electrode (e.g., a fourth node N4) of the light-emitting element EE in response to the next write gate signal GW(n+1). The second initialization voltage VAINT may be lower than the first initialization voltage VINT.

In one or more embodiments, the driving transistor T1 may include a control electrode connected to the first node N1, a first electrode connected to the second node N2, and a second electrode connected to the third node N3. The write transistor T2 may include a control electrode to which the write gate signal GW is applied, a first electrode connected to the data line DL to which the data voltage DATA is applied, and a second electrode connected to the second node N2. The compensation transistor T3 may include a control electrode to which the compensation gate signal GC is applied, a first electrode connected to the third node N3, and a second electrode connected to the first node N1. The first initialization transistor T4 may include a control electrode to which the initialization gate signal GI is applied, a first electrode to which the first initialization voltage VINT is applied, and a second electrode connected to the third node N3. The first emission transistor T5 may include a control electrode to which the emission signal EM is applied, a first electrode to which the first power supply voltage ELVDD is applied, and a second electrode connected to the second node N2. The second emission transistor T6 may include a control electrode to which the emission signal EM is applied, a first electrode connected to the third node N3, and a second electrode connected to the fourth node N4. The second initialization transistor T7 may include a control electrode to which the next write gate signal GW(n+1) is applied, a first electrode to which the second initialization voltage VAINT is applied, and a second electrode connected to a fourth node N4. The next write gate signal GW(n+1) may be defined as a write gate signal GW (e.g., the write gate signal of the (n+1) stage) of a stage next to the write gate signal GW (e.g., the write gate signal of the n stage). The light-emitting element EE may include a first electrode connected to the fourth node N4, and a second electrode to which the second power supply voltage ELVSS is applied. The storage capacitor Cst may include a first electrode to which the first power supply voltage ELVDD of the driving transistor T1 is applied, and a second electrode connected to the first node N1.

In one or more embodiments, as shown in FIG. 2, a driving transistor T1, a write transistor T2, a first emission transistor T5, a second emission transistor T6, and a second initialization transistor T7 may be a PMOS transistor. For example, the driving transistor T1, write transistor T2, first emission transistor T5, second emission transistor T6, and second initialization transistor T7 may be low temperature polycrystalline silicon thin film transistors.

In one or more embodiments, as shown in FIG. 2, the compensation transistor T3 and the first initialization transistor T4 may be NMOS transistors. For example, the compensation transistor T3 and the first initialization transistor T4 may be oxide thin film transistors. In this case, the leakage current of the compensation transistor T3 and the first initialization transistor T4 may be reduced as compared to the case where the low-temperature polycrystalline silicon thin film transistor is implemented as the compensation transistor T3 and the first initialization transistor T4.

In one or more embodiments, the pixel circuit P may further include a boost capacitor Cbst and a hold capacitor Chold. The boost capacitor Cbst may include a first electrode to which the write gate signal GW is applied, and a second electrode connected to the third node N3. The hold capacitor Chold may include a first electrode to which the first power voltage ELVDD is applied, and a second electrode connected to the second node N2.

In one or more embodiments, each of the compensation transistor T3 and the first initialization transistor T4 may be connected to the third node N3, and may be serially connected to each other. The boost capacitor Cbst may be connected to the third node N3 as well. Also, the second electrode of the compensation transistor T3 may be connected to the first electrode of the driving transistor T1, and the first electrode of the compensation transistor T3 may be connected to the second electrode of the driving transistor T1.

In one or more embodiments, the control electrode of the driving transistor T1 may be connected to the second electrode of the storage capacitor Cst. The write transistor T2 may write the data voltage DATA to the second electrode of the storage capacitor Cst in response to the write gate signal GW.

The first initialization transistor T4 may apply the first initialization voltage VINT to the second electrode of the driving transistor T1 and the compensation transistor T3 in response to the initialization gate signal GI. The compensation transistor T3 may transmit the first initialization voltage VINT to the control electrode of the driving transistor T1 and to the second electrode of the storage capacitor Cst in response to the compensation gate signal GC.

In one or more embodiments, as the first initialization transistor T4 may transmit the first initialization voltage VINT to the control electrode of the driving transistor T1 and to the storage capacitor Cst through the compensation transistor T3, and the first initialization transistor T4 may directly transmit the first initialization voltage VINT to the storage capacitor Cst, when the control electrode of the driving transistor T1 and the storage capacitor Cst are initialized, the second electrode of the driving transistor T1 may also be initialized.

Figure 3:
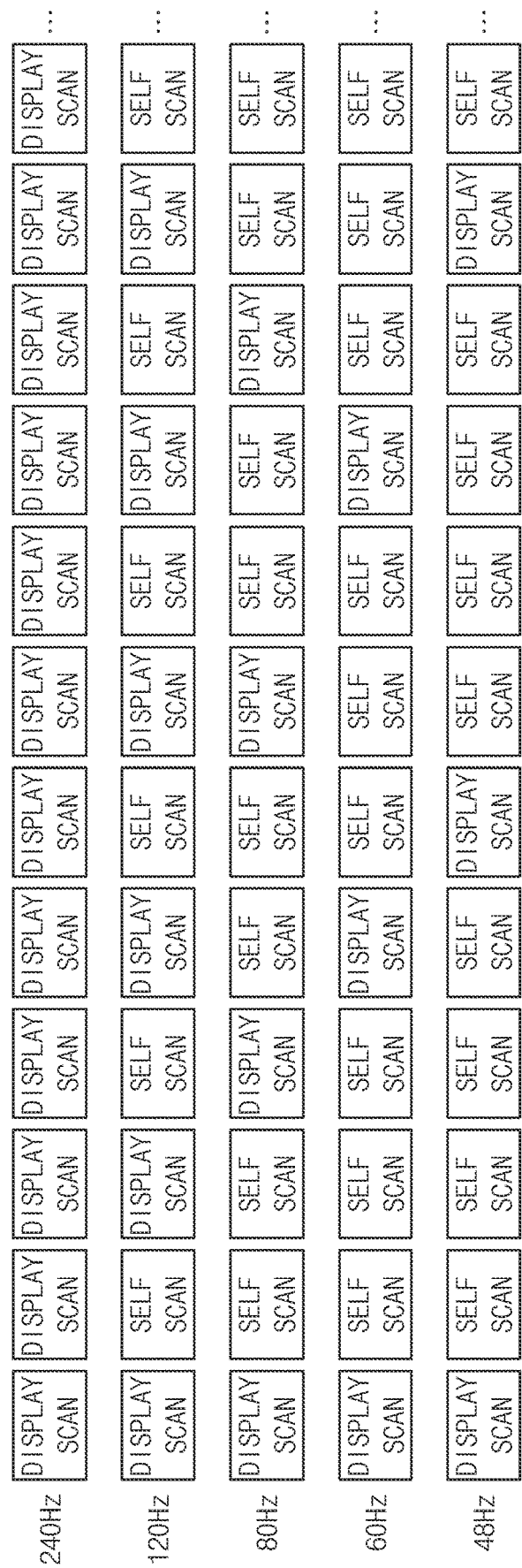
FIG. 3 is a conceptual diagram illustrating a driving operation of the display device of FIG. 1.
Figure 4:
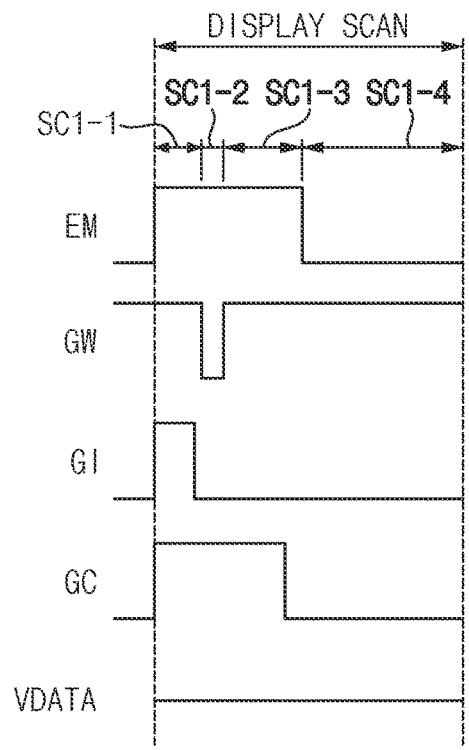
FIG. 4 is a timing diagram illustrating an example in which the display device of FIG. 1 performs a display scan operation.
Figure 5:
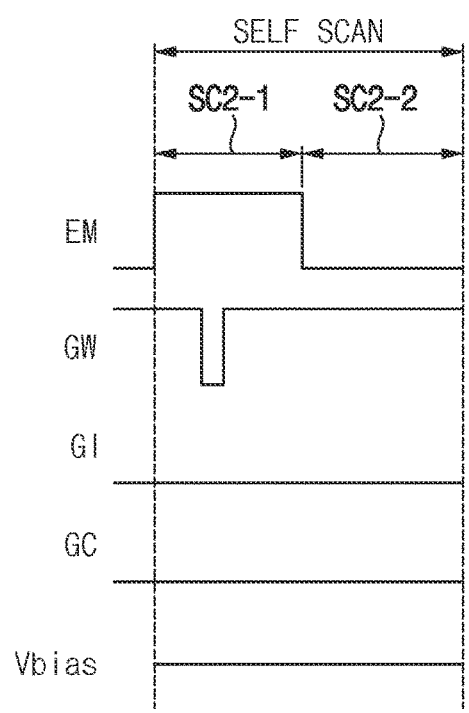
FIG. 5 is a timing diagram illustrating an example in which the display device of FIG. 1 performs a self-scan operation.

FIG. 3 is a conceptual diagram illustrating a driving operation of the display device of FIG. 1. FIG. 4 is a timing diagram illustrating an example in which the display device of FIG. 1 performs a display scan operation. FIG. 5 is a timing diagram illustrating an example in which the display device of FIG. 1 performs a self-scan operation.

Referring to FIGS. 1 to 5, the driving controller 200 may perform a display scan operation DISPLAY SCAN and a self-scan operation SELF-SCAN. The display scan operation DISPLAY SCAN may be performed in a display scan period, and the self-scan operation SELF-SCAN may be performed in a self-scan period. A data write operation may be performed when the display scan operation DISPLAY SCAN is performed, and a light emission operation may be performed without the data write operation when the self-scan operation SELF-SCAN is performed. A detailed description of this may be given later.

The driving controller 200 may continuously repeat a display scan operation DISPLAY SCAN of one frame at the maximum driving frequency of the display panel 100 (e.g., when the driving frequency of the display panel 100 is 240 Hz), display scan operation DISPLAY SCAN of one frame may be made into one driving frame.

The driving controller 200 may perform a display scan operation DISPLAY SCAN in one frame and a self-scan operation SELF-SCAN in at least one frame at driving frequencies (e.g., 120 Hz, 80 Hz, 60 Hz, and 48 Hz) other than the maximum driving frequency (e.g., it is assumed that the maximum driving frequency of the display panel 100 of one or more embodiments is 240 Hz in FIG. 3) of the display panel 100.

For example, when the driving frequency of the display panel 100 is 120 Hz, a display scan operation DISPLAY SCAN of one frame and a self-scan operation SELF-SCAN of one frame may be repeated, and a display scan operation DISPLAY SCAN of one frame and a self-scan operation SELF-SCAN of one frame may be performed in one driving frame (e.g., the display device 10 may display the same image during one driving frame).

When the driving frequency of the display panel 100 is 80 Hz, a display scan operation DISPLAY SCAN of one frame and a self-scan operation SELF-SCAN of two frames may be repeated, and the display scan operation DISPLAY SCAN of one frame and self-scan operation SELF-SCAN of two frames may be made into one driving frame.

When the driving frequency of the display panel 100 is 60 Hz, a display scan operation DISPLAY SCAN of one frame and a self-scan operation SELF-SCAN of three frames may be repeated, and a display scan operation DISPLAY SCAN of one frame and a self-scan operation SELF-SCAN of three frames may be made into one driving frame.

When the driving frequency of the display panel 100 is 48 Hz, a display scan operation DISPLAY SCAN of one frame and a self-scan operation SELF-SCAN of four frames may be repeated, and a display scan operation DISPLAY SCAN of one frame and a self-scan operation SELF-SCAN of four frames may be made into one driving frame.

As such, the driving controller 200 may vary the driving frequency (or a length of the driving frame) of the display panel 100 by adjusting a length of the self-scan period SELF-SCAN.

In the display scan period DISPLAY SCAN, the data voltage DATA may be written (e.g., a data write operation) to the storage capacitor Cst. In the self-scan period, the compensation transistor T3 and the first initialization transistor T4 may be turned off. Accordingly, when a self-scan operation SELF-SCAN is performed, a light-emitting operation may be performed without the data writing operation.

In one or more embodiments, the data voltage VDATA may be applied to the data line DL in the display scan period DISPLAY SCAN. In the self-scan period SELF-SCAN, a bias voltage Vbias may be applied to the data line DL.

For example, referring to FIGS. 2 to 4, in a first section SC1-1 of the display scan section DISPLAY SCAN, the emission signal EM, the write gate signal GW, and the initialization gate signal GI, and the compensation gate signal GC may have a high voltage level period. In this case, in the first period SC1-1 of the display scan period DISPLAY SCAN, the compensation transistor T3 and the first initialization transistor T4 may be turned on, and the write transistor T2, the first emission transistor T5, the second emission transistor T6, and the second initialization transistor T7 may be turned off. Accordingly, the control electrode of the driving transistor T1 may be initialized by applying the first initialization voltage VINT to the control electrode of the driving transistor T1.

In a second period SC1-2 of the display scan period DISPLAY SCAN, the write gate signal GW and the initialization gate signal GI may have a low voltage level period, and the compensation gate signal GC and the emission signal EM may have a high voltage level period. In this case, in the second period SC1-2 of the display scan period DISPLAY SCAN, the write transistor T2 and the compensation transistor T3 are turned on, and the first initialization transistor T4, the first emission transistor T5 and the second emission transistor T6 may be turned off. Accordingly, the data voltage obtained by compensating the threshold voltage of the driving transistor T1 is applied (e.g., written to the storage capacitor Cst) to the control electrode of the driving transistor T1 (e.g., the first electrode of the storage capacitor Cst). Accordingly, the data voltage VDATA obtained by compensating for the threshold voltage of the driving transistor T1 may be stored in the storage capacitor Cst. Also, the data voltage VDATA may be stored in the hold capacitor Chold.

In a third period SC1-3 of the display scan period DISPLAY SCAN, the initialization gate signal GI may have a low voltage level period, the emission signal EM, the write gate signal GW, and compensation gate signal GC may have a high voltage level period. In this case, in the third period SC1-3 of the display scan period DISPLAY SCAN, the compensation transistor T3 may be turned on, and the write transistor T2, the first initialization transistor T4, the first emission transistor T5, the second emission transistor T6, and the second initialization transistor T7 may be turned off. Accordingly, the data voltage VDATA whose threshold voltage is compensated for by the data voltage VDATA stored in the hold capacitor Chold may be written into the storage capacitor Cst.

In a fourth period SC1-4 of the display scan period DISPLAY SCAN, the emission signal EM, the initialization gate signal GI, and the compensation gate signal GC may have a low voltage level period, and write gate signal GW may have a high voltage level period. In this case, in the fourth period SC1-4 of the display scan period DISPLAY SCAN, the first emission transistor T5 and the second emission transistor T6 may be turned on, and the write transistor T2, the compensation transistor T3, the first initialization transistor T4, and the second initialization transistor T7 may be turned off. Accordingly, the driving transistor T1 may generate the driving current based on the voltage of the control electrode of the driving transistor T1, and the driving current may flow to the light-emitting element EE. The light-emitting element EE may emit light (e.g., light-emitting operation) due to the driving current.

However, the present disclosure is not limited thereto, and in the display scan period DISPLAY SCAN, the write gate signal GW may have two or more low voltage level periods.

In the self-scan period SELF-SCAN, the initialization gate signal GI and the compensation gate signal GC may have a low voltage level period. In this case, the compensation transistor T3, the first initialization transistor T4, and the second initialization transistor T7 may be turned off.

In the first period SC2-1 of the self-scan period SELF-SCAN, the write gate signal GW may have a low voltage level period at least once. However, the present disclosure is not limited thereto. In this section, the emission signal EM may have a high voltage level section. In this case, the write transistor T2 may be turned on, and the first emission transistor T5 and the second emission transistor T6 may be turned off. In this case, in the first period SC2-1 of the self-scan period SELF-SCAN, the bias voltage Vbias is applied to the driving transistor T1, and the bias voltage Vbias is applied, thereby driving the driving transistor T1. The hysteresis characteristic of can be initialized.

In the second period SC2-2 of the self-scan period SELF-SCAN, the emission signal EM may have a low voltage level period, and the write gate signal GW may have a high voltage level period. In this case, in the second period SC2-2 of the self-scan period SELF-SCAN, the first emission transistor T5 and the second emission transistor T6 may be turned on, and the write transistor T2, the compensation transistor T3, the first initialization transistor T4, and the second initialization transistor T7 may be turned off. Accordingly, the driving transistor T1 may generate a driving current based on the voltage of the control electrode of the driving transistor T1, and the driving current may flow to the light-emitting element EE. The light-emitting element EE may emit light (e.g., during a light-emitting operation) due to a driving current. Therefore, when the self-scan operation SELF-SCAN is performed, the data write operation may not be performed.

In one or more embodiments, as the display device 10 includes the compensation transistor T3 and the first initialization transistor T4 connected in series through the third node N3, a connection between the second electrode of the boost capacitor Cbst and the control electrode of the driving transistor T1 may be blocked in the self-scan period SELF-SCAN. Accordingly, the influence of the write gate signal GW variation on the control electrode of the driving transistor T1 may be reduced or minimized.

In addition, as the display device 10 additionally includes a hold capacitor Chold, a compensation time for the threshold voltage of the driving transistor T1 may be secured.

Figure 6:
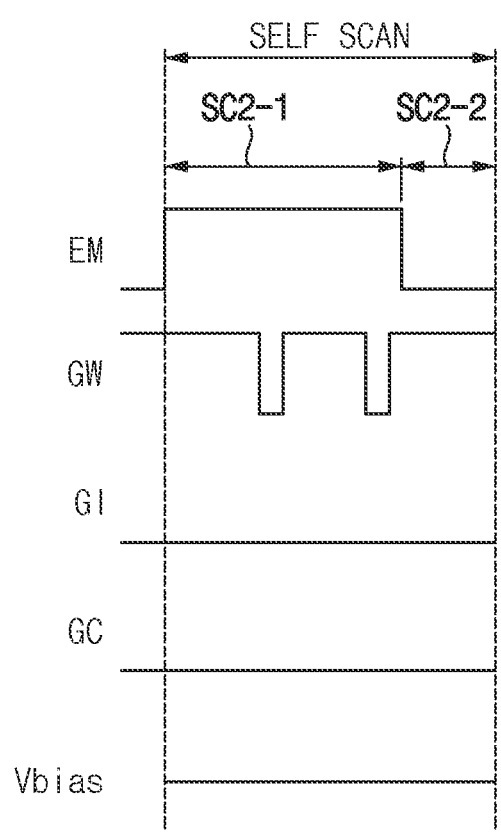
FIG. 6 is a timing diagram illustrating another example of FIG. 5.

FIG. 6 is a timing diagram illustrating another example of FIG. 5.

For example, a self-scan period SELF-SCAN described with reference to FIG. 6 may differ from the self-scan period SELF-SCAN described with reference to FIG. 5 only in the number of times the write gate signal GW has a low voltage level period. Therefore, redundant descriptions may be omitted.

Referring to FIG. 6, in the first period SC2-1 of the self-scan period SELF-SCAN, the write gate signal GW may have two low voltage level periods. During these sections, the emission signal EM may have a high voltage level section. In this case, the write transistor T2 may be turned on, and the first emission transistor T5 and the second emission transistor T6 may be turned off. In this case, in the first period SC2-1 of the self-scan period SELF-SCAN, the bias voltage Vbias may be applied to the driving transistor T1, and as the bias voltage Vbias is applied, the hysteresis characteristic of the driving transistor T1 may be initialized.

Figure 7:
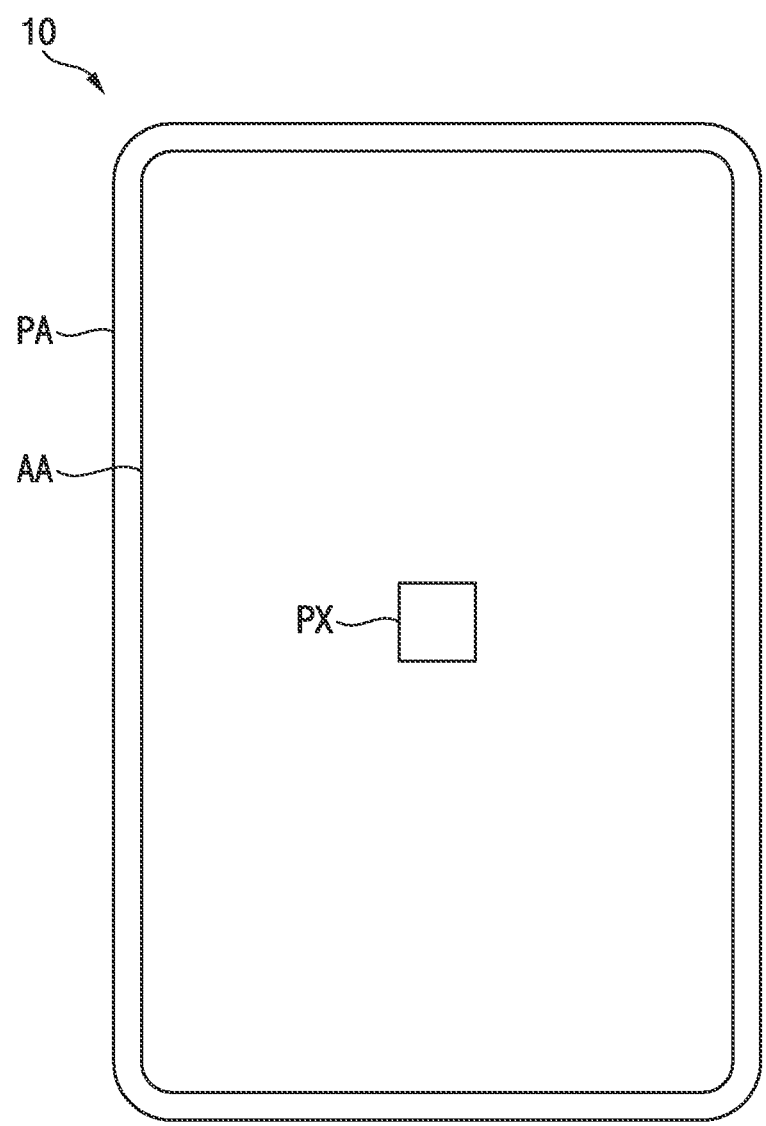
FIG. 7 is a plan view illustrating a display device according to one or more embodiments of the present disclosure.

FIG. 7 is a plan view illustrating a display device according to one or more embodiments of the present disclosure.

Referring to FIGS. 1, 2, and 7, the display device 10 may include a plurality of pixels PX. The pixels PX may correspond to the pixel circuit P of FIGS. 1 and 2.

The display device 10 may include a display area AA and a peripheral area PA. The display area AA may be an area for displaying an image. The planar shape of the display area AA may be a rectangular shape or, as shown in FIG. 1, a rectangular shape with rounded corners. However, the planar shape of the display area AA is not limited thereto, and the display area AA may have various planar shapes, such as a circular shape, an elliptical shape, and a polygonal shape.

The peripheral area PA may be located around the display area AA. The peripheral area PA may surround the display area AA. The peripheral area PA may be an area in which an image is not displayed. In one or more embodiments, a display panel driver (e.g., a driving controller 200, a gate driver 300, a data driver 400, and an emission driver 500) for displaying an image of the display unit AA may be located in the peripheral area PA.

Pixels PX may be arranged in a matrix on the display area AA. Signal lines, such as gate lines (e.g., gate lines GWL, GCL, and GIL of FIG. 1) and data lines (e.g., data line DL of FIG. 1), may be located in the display area AA. The signal lines, such as the gate line and the data line, may be connected to each of the pixels PX. Each of the pixels PX may receive a gate signal, a data signal, and the like from the signal lines.

FIGS. 8 to 13 are layout views for explaining an example of a pixel included in the display device of FIG. 7.

Figure 8:
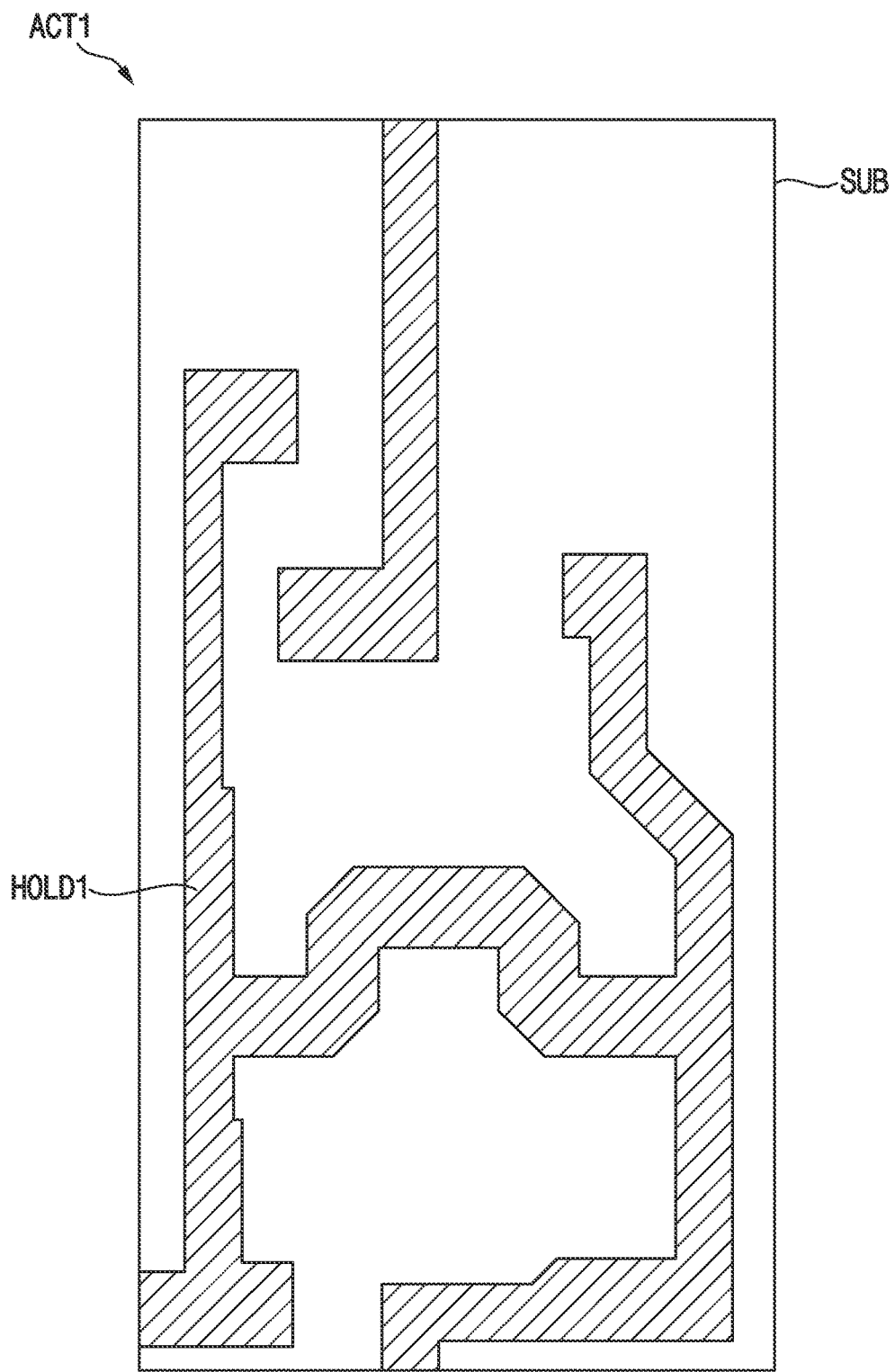
FIGS. 8 to 13 are layout views for explaining an example of a pixel included in the display device of FIG. 7.

Referring further to FIG. 8, a buffer layer may be located on a substrate SUB. A first active pattern ACT1 may be located on the buffer layer. The first active pattern ACT1 may include a silicon semiconductor. For example, the silicon semiconductor may include amorphous silicon, polycrystalline silicon, and the like. For example, the first active pattern ACT1 may include the polycrystalline silicon formed by crystallizing the amorphous silicon.

In one or more embodiments, ions may be implanted into the first active pattern ACT1. For example, when transistors formed of the first active pattern ACT1 (e.g., the driving transistor T1, the write transistor T2, the first emission transistor T5, the second emission transistor T6, and the second initialization transistor T7) are the PMOS transistor, ions, such as boron, may be implanted into the first active pattern ACT1.

The first active pattern ACT1 may include a first hold electrode HOLD1. The first hold electrode HOLD1 may integrally formed with the first active pattern ACT1 of each of the driving transistor T1, the write transistor T2, the first emission transistor T5, and the second emission transistor T6.

Figure 9:
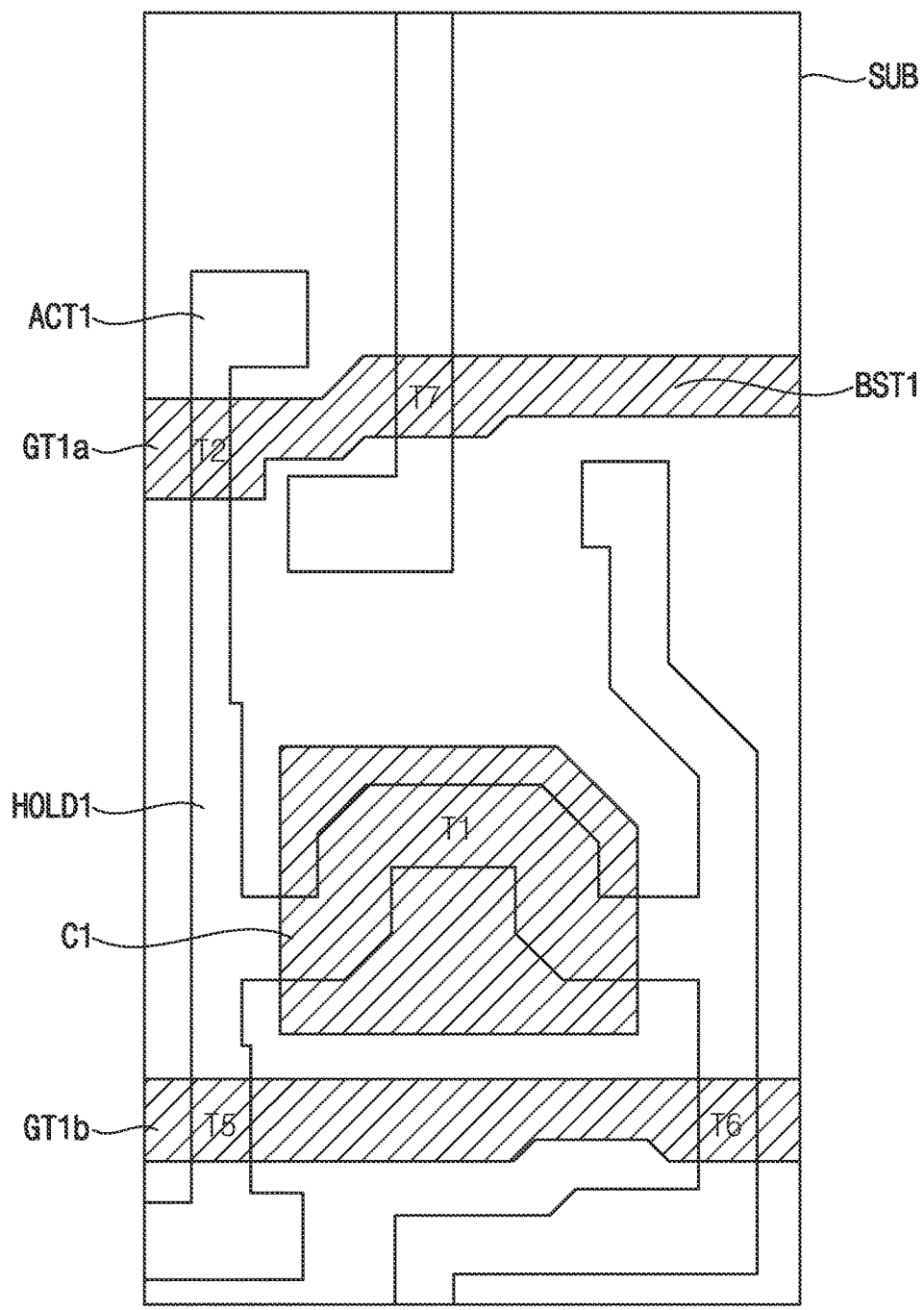

Referring further to FIG. 9, a first gate insulation layer may be located on the first active pattern ACT1. A first gate layer GT1 may be located on the first gate insulation layer.

The first gate layer GT1 may include a first gate line GT1a, a first capacitor electrode C1, and a second gate line GT1b. The first gate line GT1a and the second gate line GT1b may extend in the third direction D3. The first gate line GT1a may transmit the write gate signal GW. The second gate line GT1b may transmit the emission signal EM.

The first active pattern ACT1 and the first capacitor electrode C1 may overlap each other. The driving transistor T1 may be formed by overlapping the first active pattern ACT1 and the first capacitor electrode C1.

The first gate line GT1a and the first active pattern ACT1 may overlap. A write transistor T2 and a second initialization transistor T7 may be formed by overlapping the first gate line GT1a and the first active pattern ACT1. The write transistor T2 and the second initialization transistor T7 may receive the write gate signal GW and the next write gate signal GW(n+1) from the first gate line GT1a, respectively.

The second gate line GT1b and the first active pattern ACT1 may overlap each other. A first emission transistor T5 and a second emission transistor T6 may be formed by overlapping the second gate line GT1b and the first active pattern ACT1. The first emission transistor T5 and the second emission transistor T6 may receive the emission signal EM from the second gate line GT1b.

The first gate line GT1a may include a first boost electrode BST1. The first boost electrode BST1 may be integrally formed with each of the gate electrode of the write transistor T2 and the second initialization transistor T7.

Figure 10:
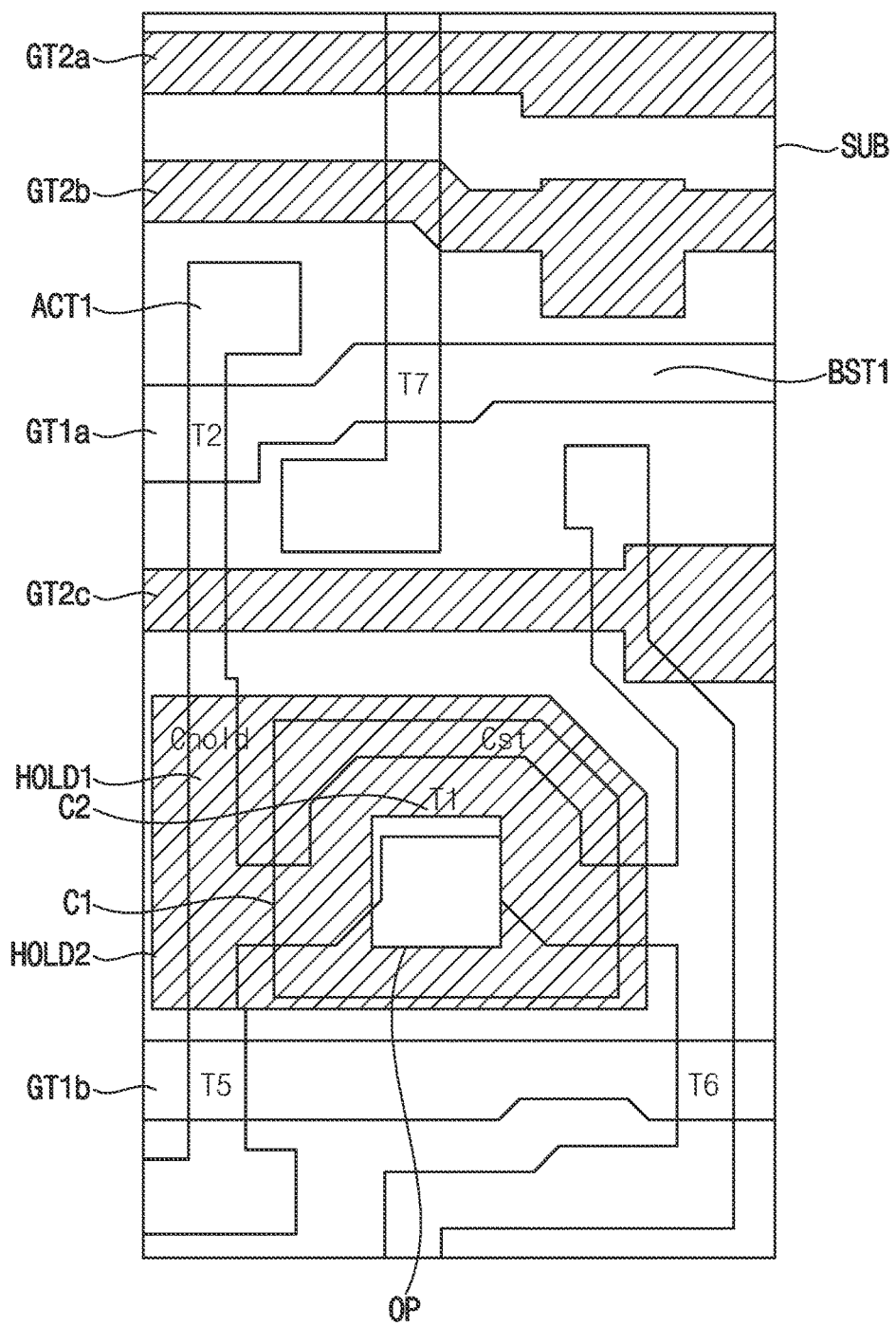

Further referring to FIG. 10, a second gate insulation layer may be located on the first gate layer GT1. A second gate layer GT2 may be located on the second gate insulation layer.

The second gate layer GT2 may include a third gate line GT2a, a fourth gate line GT2b, a fifth gate line GT2c, a second capacitor electrode C2, and a second hold electrode HOLD2. The third gate line GT2a, fourth gate line GT2b, and fifth gate line GT2c may extend in the third direction D3. The third gate line GT2a may transmit the first initialization voltage VINT. The fourth gate line GT2b may transmit the initialization gate signal GI. The fifth gate line GT2c may transmit the compensation gate signal GC.

The second capacitor electrode C2 and the second hold electrode HOLD2 may be integrally formed. The second hold electrode HOLD2 may extend from the second capacitor electrode C2 in a fourth direction D4 opposite to the third direction D3.

The second capacitor electrode C2 may overlap the first capacitor electrode C1. The first capacitor electrode C1 and the second capacitor electrode C2 may constitute a storage capacitor Cst. The second capacitor electrode C2 may include/define an opening OP. A first capacitor electrode C1 may be exposed through the opening OP.

The second hold electrode HOLD2 may overlap the first hold electrode HOLD1. The first hold electrode HOLD1 and the second hold electrode HOLD2 may constitute a hold capacitor Chold.

Figure 11:
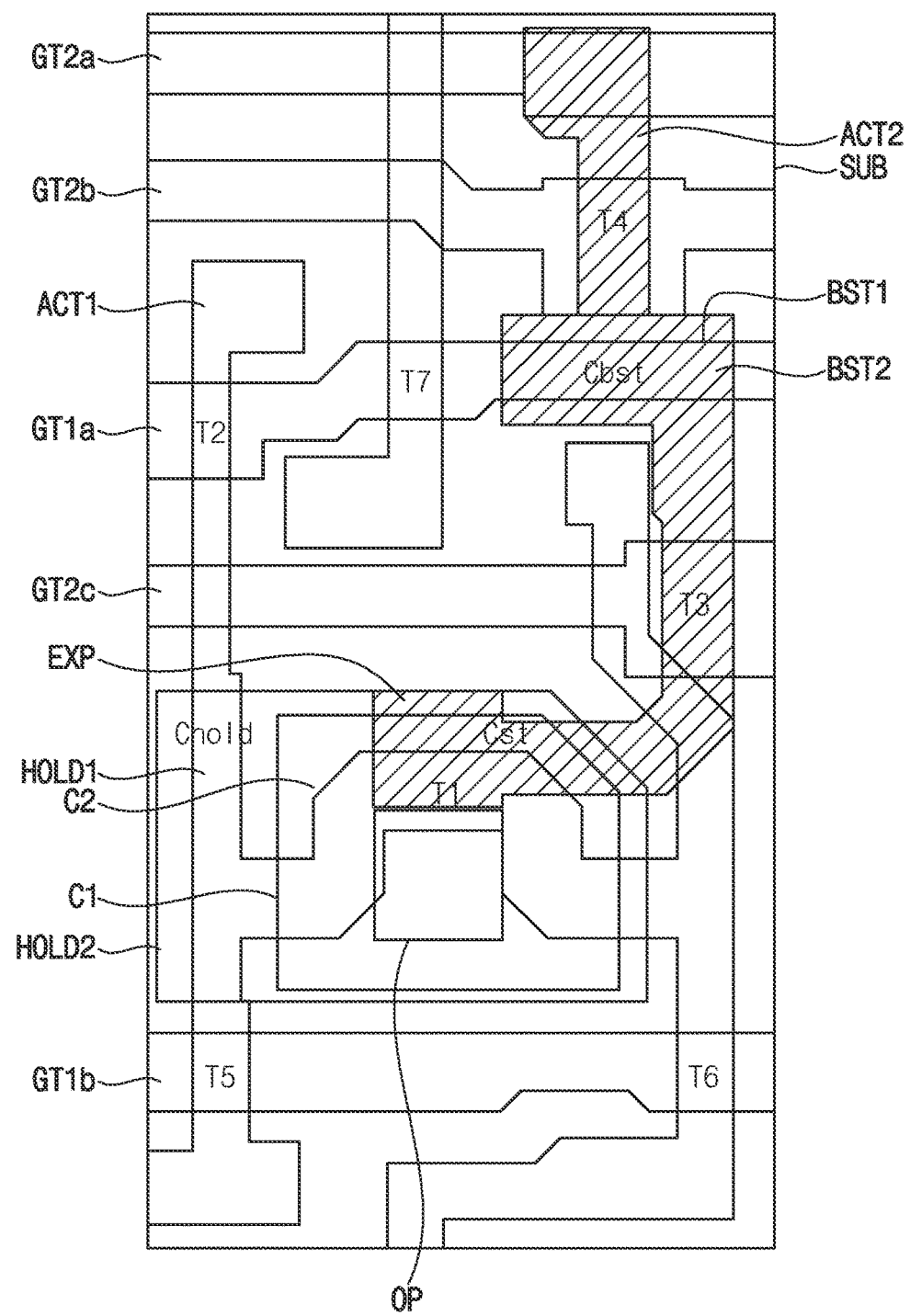

Referring further to FIG. 11, a first interlayer insulation layer may be located on the second gate layer GT2. A second active pattern ACT2 may be located on the first interlayer insulation layer. The second active pattern ACT2 may include an oxide semiconductor. The second active pattern ACT2 may include a material that is different from that of the first active pattern ACT1.

However, the present disclosure is not limited thereto, and in one or more other embodiments, a third capacitor electrode may be located on the first interlayer insulation layer located on the second gate layer GT2. The third capacitor electrode may overlap the first capacitor electrode C1 and the second capacitor electrode C2. An insulation layer may be further located on the third capacitor electrode, and a second active pattern ACT2 may be located on the insulation layer.

For example, the second active pattern ACT2 may include a binary compound (ABx), a ternary compound (ABxCy), a four-component compound (ABxCyDz), and the like containing indium (In), zinc (Zn), gallium (Ga), tin (Sn), titanium (Ti), aluminum (Al), hafnium (Hf), zirconium (Zr), magnesium (Mg), and the like. The second active pattern ACT2 may include indium-gallium-zinc oxide.

In one or more embodiments, the transistor formed of the second active pattern ACT2 (e.g., the compensation transistor T3 and the first initialization transistor T4) may be the NMOS transistor.

The second active pattern ACT2 may include a second boost electrode BST2. The second boost electrode BST2 may overlap the first boost electrode BST1. The first boost electrode BST1 and the second boost electrode BST2 may constitute a boost capacitor Cbst.

Figure 12:
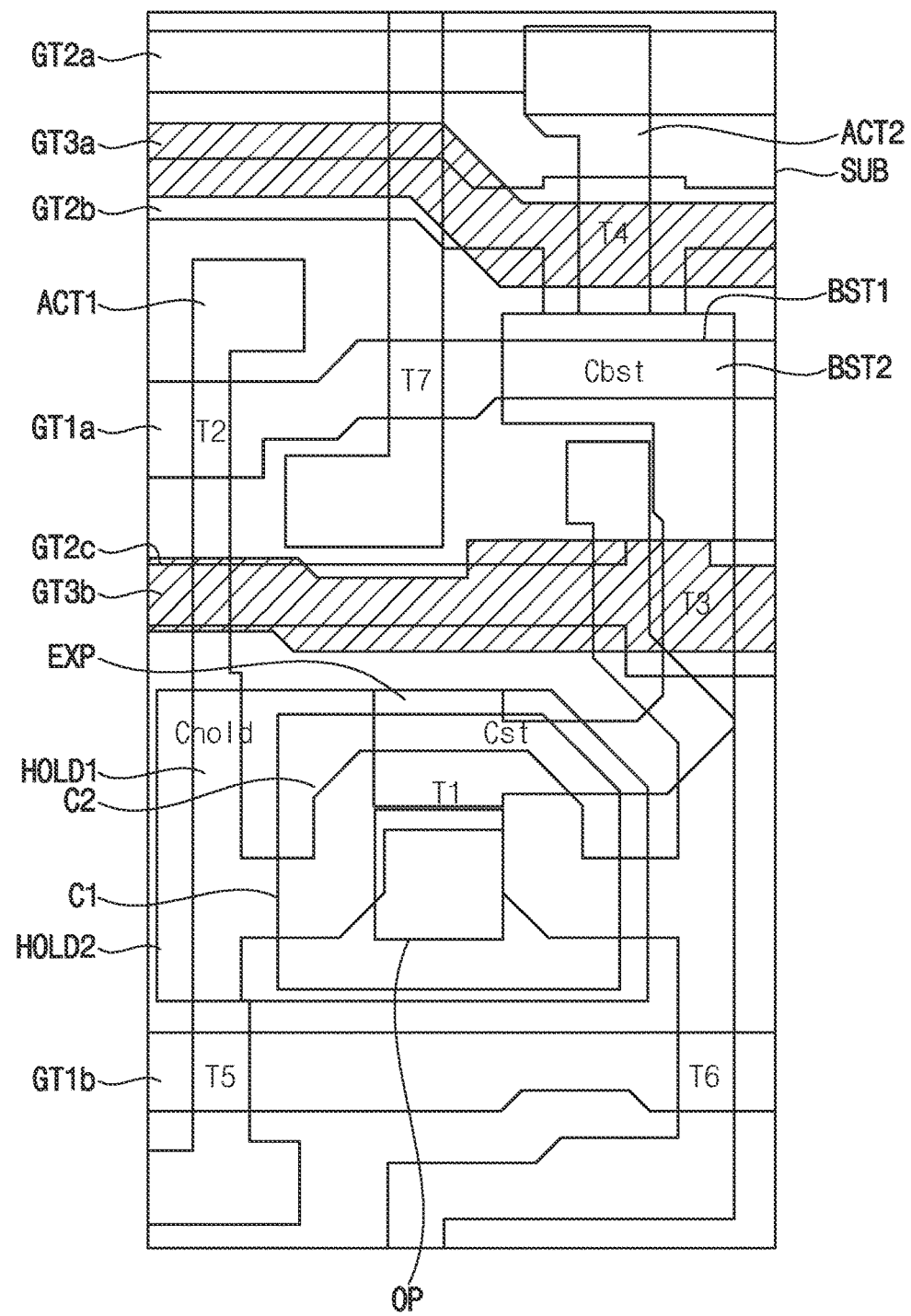

Further referring to FIG. 12, a third gate insulation layer may be located on the second active pattern ACT2. A third gate layer GT3 may be located on the third gate insulation layer.

The third gate layer GT3 may include a sixth gate line GT3a and a seventh gate line GT3b. The sixth gate line GT3a and the seventh gate line GT3b may extend in the third direction D3.

The fifth gate line GT2c, the second active pattern ACT2, and the seventh gate line GT3b may overlap each other. The compensation transistor T3 may be formed by overlapping the fifth gate line GT2c, the second active pattern ACT2, and the seventh gate line GT3b. The compensation transistor T3 may receive the compensation gate signal GC from the fifth gate line GT2c.

The fourth gate line GT2b, the second active pattern ACT2, and the sixth gate line GT3a may overlap each other. The first initialization transistor T4 may be formed by overlapping the fourth gate line GT2b, the second active pattern ACT2, and the sixth gate line GT3a. The first initialization transistor T4 may receive the initialization gate signal GI from the fourth gate line GT2b.

Figure 13:
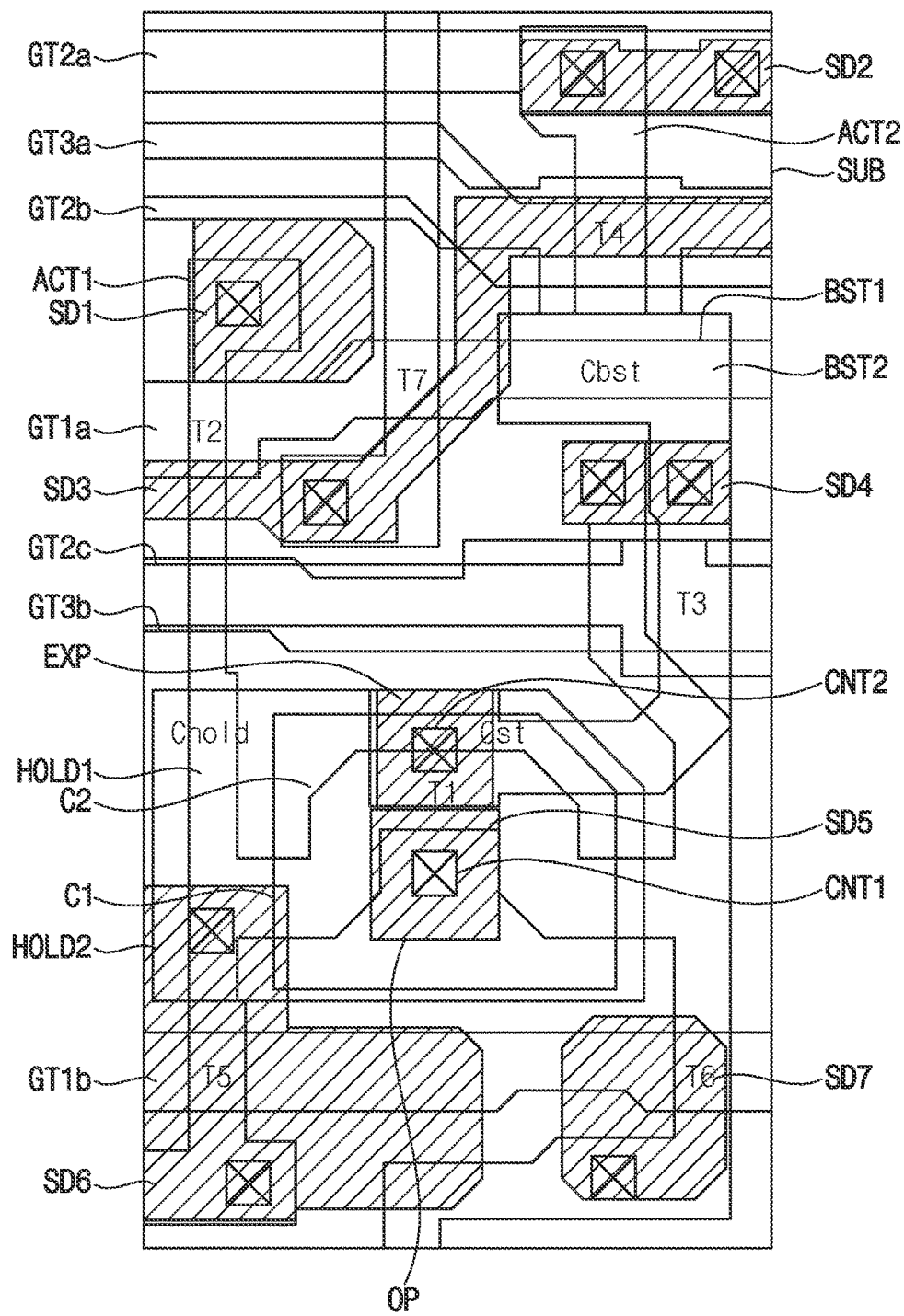

Referring further to FIG. 13, a second interlayer insulation layer may be located on the third gate layer GT3. A conductive layer SD may be located on the second interlayer insulation layer.

The conductive layer SD may include a first connection electrode SD1, a second connection electrode SD2, a third connection electrode SD3, a fourth connection electrode SD4, a fifth connection electrode SD5, a sixth connection electrode SD6, and a seventh connection electrode SD7.

The first connection electrode SD1 may connect the data line DL and the first active pattern ACT1. Accordingly, the write transistor T2 may receive the data voltage VDATA through the first connection electrode SD1.

The second connection electrode SD2 may connect the second active pattern ACT2 and the third gate line GT2a. Accordingly, the first initialization transistor T4 may receive the first initialization voltage VINT through the second connection electrode SD2.

The third connection electrode SD3 may transmit the second initialization voltage VAINT. The third connection electrode SD3 may transmit the second initialization voltage VAINT to the first active pattern ACT1. Accordingly, the second initialization transistor T7 may receive the second initialization voltage VAINT through the third connection electrode SD3.

In one or more embodiments, the fourth connection electrode SD4 may connect the first active pattern ACT1 and the second active pattern ACT2. Therefore, the boost capacitor Cbst may be connected to the driving transistor T1 through the compensation transistor T3.

In one or more embodiments, the fifth connection electrode SD5 may connect the second active pattern ACT2 and the first capacitor electrode C1. The fifth connection electrode SD5 may connect the first capacitor electrode C1 forming the storage capacitor Cst and the extension portion EXP of the second active pattern ACT2.

In one or more embodiments, the second active pattern ACT2 may include an extension portion EXP. The extension portion EXP may be located on the second capacitor electrode C2, and may overlap the first capacitor electrode C1 and the second capacitor electrode C2.

The fifth connection electrode SD5 may overlap the first capacitor electrode C1 and the second capacitor electrode C2. The fifth connection electrode SD5 may be connected to the first capacitor electrode C1 through the opening OP. The fifth connection electrode SD5 and the first capacitor electrode C1 may be connected through the first contact hole CNT1. The fifth connection electrode SD5 may be connected to the extension portion EXP through the second contact hole CNT2. That is, the fifth connection electrode SD5 may be connected to the extension portion EXP on the second capacitor electrode C2.

In the second active pattern ACT2, the second boost electrode BST2 may be integrally formed with the extension portion EXP. In the second active pattern ACT2, the second active pattern of the first initialization transistor T4, the second boost electrode BST2, the second active pattern of the compensation transistor T3, and the extension portion EXP may be integrally formed. That is, the second active pattern ACT2 may extend from the second active pattern of the first initialization transistor T4 to the extension portion EXP via the second boost electrode BST2 and the second active pattern of the compensation transistor T3.

That is, as the extension portion EXP overlaps the first capacitor electrode C1 and the second capacitor electrode C2 by extending from the second active pattern ACT2 forming the compensation transistor T3. The first contact hole CNT1 and the second contact hole CNT2 may overlap the first capacitor electrode C1 and the second capacitor electrode C2. Therefore, in the first gate layer GT1, other structures may not exist in the third direction D3 and the fourth direction D4 from the first capacitor electrode C1. Similarly, in the second gate layer GT2, other structures may not exist in the third direction D3 from the second capacitor electrode C2. Accordingly, area of each of the first capacitor electrode C1 and the second capacitor electrode C2 may increase in the third direction D3.

The sixth connection electrode SD6 may connect the second capacitor electrode C2, the first active pattern ACT1, and the first power voltage line. The first power voltage line may be located on the sixth connection electrode SD6, and may transmit the first power voltage ELVDD. The sixth connection electrode SD6 may transmit the first power voltage ELVDD from the first power voltage line to the first emission transistor T5 and the storage capacitor Cst.

The seventh connection electrode SD7 may connect the first active pattern ACT1 and the first electrode (e.g., anode electrode) of the light-emitting element EE. The seventh connection electrode SD7 may transmit the driving current to the light-emitting element EE.

In one or more embodiments, as the second active pattern ACT2 includes an extension portion EXP overlapping the first capacitor electrode C1 and the second capacitor electrode C2, and as the first capacitor electrode C1 and the extension portion EXP are connected through the fifth connection electrode SD5 on the first capacitor electrode C1 and the second capacitor electrode C2, the area of each of the first capacitor electrode C1 and the second capacitor electrode C2 may increase. Accordingly, the capacity of the storage capacitor Cst may increase.

Also, similarly, the area of each of the first hold electrode HOLD1 and the second hold electrode HOLD2 may increase in the third direction D3. Accordingly, the capacity of the hold capacitor Chold may increase.

Figure 14:
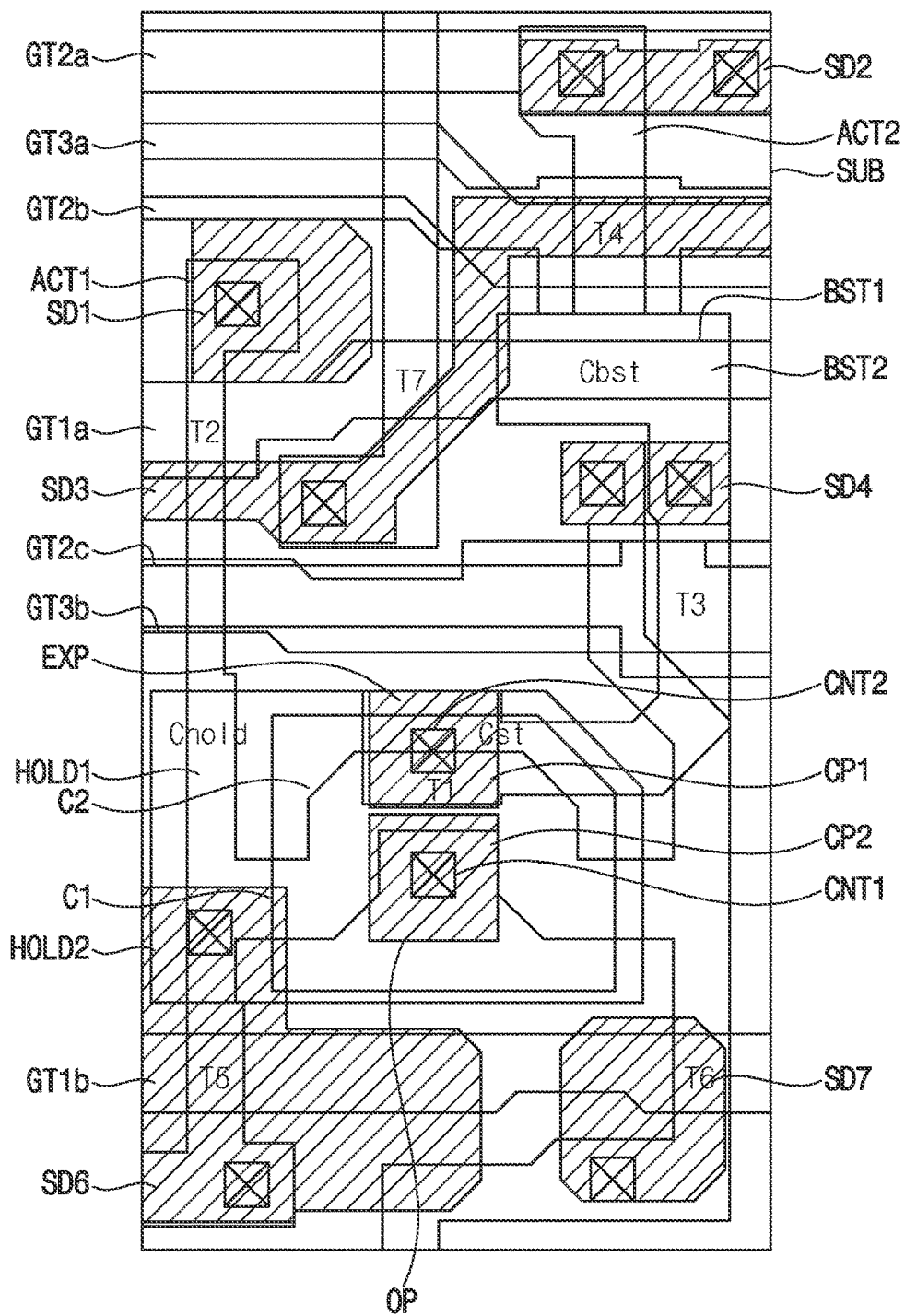
FIG. 14 is a layout diagram for explaining another example of a pixel included in the display device of FIG. 7.

FIG. 14 is a layout diagram for explaining another example of a pixel included in the display device of FIG. 7.

For example, FIG. 14 may be another example of FIG. 13. Unlike the pixels described with reference to FIG. 13, a pixel described with reference to FIG. 14 may include a first connection pattern CP1 and a second connection pattern CP2 instead of the fifth connection electrode SD5. Therefore, redundant descriptions may be omitted.

Referring to FIG. 14, a second interlayer insulation layer may be located on the third gate layer GT3. A conductive layer SD may be located on the second interlayer insulation layer.

The conductive layer SD may include a first connection electrode SD1, a second connection electrode SD2, a third connection electrode SD3, a fourth connection electrode SD4, a sixth connection electrode SD6, a seventh connection electrode SD7, a first connection pattern CP1, and a second connection pattern CP2.

In one or more embodiments, the second active pattern ACT2 may include an extension portion EXP. The extension portion EXP may be located on the second capacitor electrode C2, and may overlap the first capacitor electrode C1 and the second capacitor electrode C2.

In one or more embodiments, the first connection pattern CP1 may be located on the second active pattern ACT2. The first connection pattern CP1 may be connected to the extension portion EXP. The first connection pattern CP1 may overlap the first capacitor electrode C1 and the second capacitor electrode C2.

In one or more embodiments, the second connection pattern CP2 may be located on the same layer as the first connection pattern CP1. The second connection pattern CP2 may be spaced apart from the first connection pattern CP1. The second connection pattern CP2 may be connected to the first capacitor electrode C1.

The second connection pattern CP2 may be connected to the first capacitor electrode C1 through the opening OP defined in the second capacitor electrode C2. The second connection pattern CP2 and the first capacitor electrode C1 may be connected through the first contact hole CNT1. The first connection pattern CP1 may be connected to the extension portion EXP through the second contact hole CNT2.

In one or more embodiments, as the second active pattern ACT2 includes an extension portion EXP overlapping the first capacitor electrode C1 and the second capacitor electrode C2, and as the extension portion EXP is connected to the first connection pattern CP1 on the first capacitor electrode C1 and the second capacitor electrode C2, and as the first capacitor electrode C1 is connected to the second connection pattern CP2 on the first capacitor electrode C1 and the second capacitor electrode C2, the area of each of the first capacitor electrode C1 and the second capacitor electrode C2 may increase in the third direction D3. Accordingly, the capacity of the storage capacitor Cst may increase.

Figure 15:
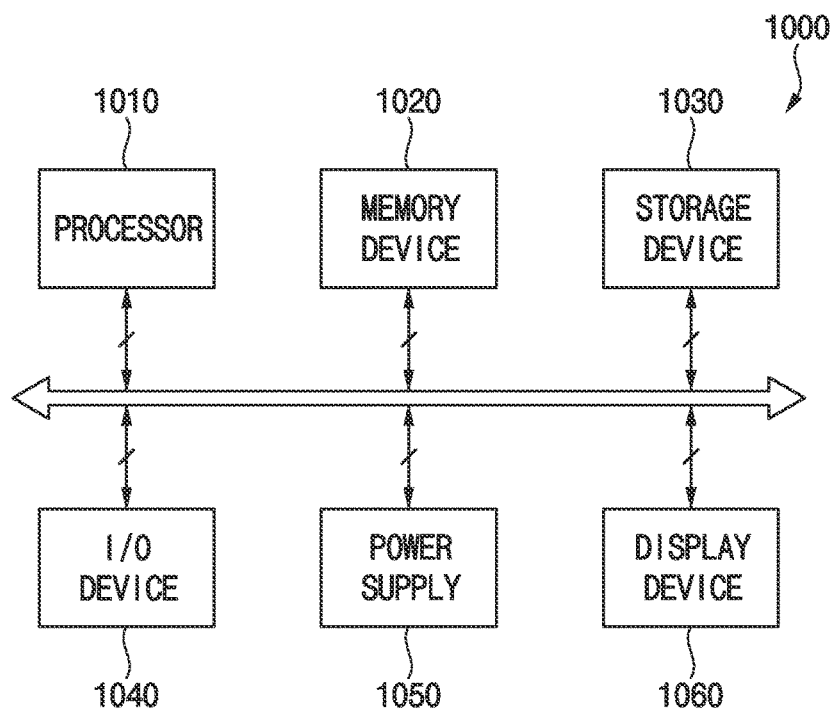
FIG. 15 is a block diagram showing an electronic device according to embodiments of the present inventive concept.
Figure 16:
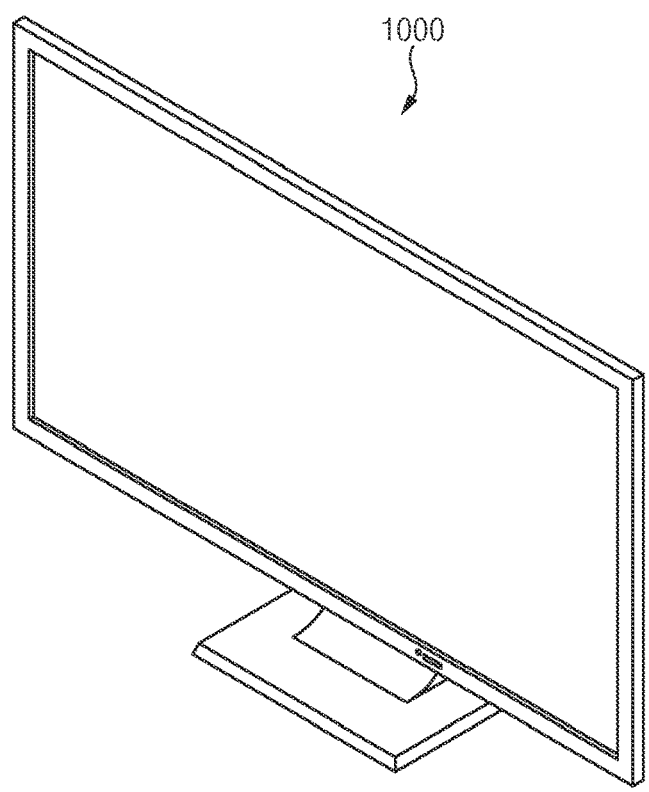
FIG. 16 is a diagram showing an example in which the electronic device of FIG. 15 is implemented as a television.

FIG. 15 is a block diagram showing an electronic device according to embodiments of the present inventive concept. FIG. 16 is a diagram showing an example in which the electronic device of FIG. 15 is implemented as a television.

Referring to FIGS. 15 and 16, the electronic device 1000 may include a processor 1010, a memory device 1020, a storage device 1030, an input/output (I/O) device 1040, a power supply 1050, and a display device 1060. Here, the display device 1060 may be the display device of FIG. 1. In addition, the electronic device 1000 may further include a plurality of ports for communicating with a video card, a sound card, a memory card, a universal serial bus (USB) device, other electronic devices, etc. In one or more embodiments, as shown in FIG. 16, the electronic device 1000 may be implemented as a television. However, the electronic device 1000 is not limited thereto. For example, the electronic device 1000 may be implemented as a cellular phone, a video phone, a smart pad, a smart watch, a tablet PC, a car navigation system, a computer monitor, a laptop, a head mounted display (HMD) device, etc.

The processor 1010 may perform various computing functions. The processor 1010 may be a microprocessor, a central processing unit (CPU), an application processor (AP), etc. The processor 1010 may be coupled to other components via an address bus, a control bus, a data bus, etc. Further, the processor 1010 may be coupled to an extended bus, such as a peripheral component interconnection (PCI) bus.

The memory device 1020 may store data for operations of the electronic device 1000. For example, the memory device 1020 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. and/or at least one volatile memory device, such as a dynamic random access memory (DRAM) device, a static random access memory (SRAM) device, a mobile DRAM device, etc.

The storage device 1030 may include a solid state drive (SSD) device, a hard disk drive (HDD) device, a CD-ROM device, etc.

The I/O device 1040 may include an input device, such as a keyboard, a keypad, a mouse device, a touch pad, a touch screen, etc., and an output device, such as a printer, a speaker, etc. In some embodiments, the I/O device 1040 may include the display device 1060.

The power supply 1050 may provide power for operations of the electronic device 1000. For example, the power supply 1050 may be a power management integrated circuit (PMIC).

The display device 1060 may display an image corresponding to visual information of the electronic device 1000. For example, the display device 1060 may be an organic light-emitting display device or a quantum dot light-emitting display device, but is not limited thereto. The display device 1060 may be coupled to other components via the buses or other communication links.

The display device and the pixel circuit according to the embodiments may be applied to a display device included in a computer, a notebook, a mobile phone, a smartphone, a smart pad, a PMP, a PDA, an MP3 player, or the like.

Although the display device and the pixel circuit according to the embodiments have been described with reference to the drawings, the illustrated embodiments are examples, and may be modified and changed by a person having ordinary knowledge in the relevant technical field without departing from the technical spirit described in the following claims, with functional equivalents thereof to be included therein.

What is claimed is:

1. A pixel circuit comprising:
a storage capacitor comprising a first electrode and a second electrode;
a driving transistor comprising a first electrode, a control electrode connected the second electrode of the storage capacitor, and a second electrode connected to a third node, and configured to generate a driving current;
a write transistor configured to write a data voltage to the second electrode of the storage capacitor in response to a write gate signal;
a first initialization transistor configured to apply a first initialization voltage to the second electrode of the driving transistor in response to an initialization gate signal;
a compensation transistor directly connected to the driving transistor at the third node, configured to transmit the first initialization voltage to the control electrode of the driving transistor and to the second electrode of the storage capacitor in response to a compensation gate signal, and configured to receive the first initialization voltage from the first initialization transistor in response to the initialization gate signal; and
a light-emitting element configured to emit light by receiving the driving current.

2. The pixel circuit of claim 1, wherein the control electrode of the driving transistor is connected to a first node,
wherein the first electrode of the driving transistor is connected to a second node,
wherein the first electrode of the storage capacitor is configured to receive a first power supply voltage, and
wherein the second electrode of the storage capacitor is connected to the first node.

3. The pixel circuit of claim 2, wherein the write transistor comprises a control electrode configured to receive the write gate signal, a first electrode connected to a data line configured to receive the data voltage, and a second electrode connected to the second node,
   wherein the compensation transistor comprises a control electrode configured to receive the compensation gate signal, a first electrode connected to the third node, and a second electrode connected to the first node, and
   wherein the first initialization transistor comprises a control electrode configured to receive the initialization gate signal, a first electrode configured to receive the first initialization voltage, and a second electrode connected to the third node.

4. The pixel circuit of claim 3, further comprising:
   a first emission transistor comprising a control electrode configured to receive an emission signal, a first electrode configured to receive the first power supply voltage, and a second electrode connected to the second node;
   a second emission transistor comprising a control electrode configured to receive the emission signal, a first electrode connected to the third node, and a second electrode connected to a fourth node;
   a second initialization transistor comprising a control electrode configured to receive a next write gate signal, a first electrode configured to receive a second initialization voltage, and a second electrode connected to the fourth node; and
   a boost capacitor comprising a first electrode configured to receive the write gate signal, and a second electrode connected to the third node.

5. The pixel circuit of claim 4, further comprising a hold capacitor comprising a first electrode configured to receive the first power supply voltage, and a second electrode connected to the second node.

6. The pixel circuit of claim 3, wherein, in a display scan period, the data voltage is configured to be applied to the data line, and
   wherein, in a self-scan period, a bias voltage is configured to be applied to the data line.

7. The pixel circuit of claim 6, wherein during the self-scan period, the compensation transistor is turned-off.

* * * * *